United States Patent [19]

Kameya

[11] Patent Number: 4,656,443
[45] Date of Patent: Apr. 7, 1987

[54] VARIABLE DISTRIBUTED CONSTANT DELAY LINE HAVING MOVABLE SLIDER CONTACT

[75] Inventor: Kazuo Kameya, Tsurugashima, Japan

[73] Assignee: Elmec Corporation, Saitama, Japan

[21] Appl. No.: 690,182

[22] Filed: Jan. 10, 1985

[30] Foreign Application Priority Data

Jan. 13, 1984 [JP] Japan .................................. 59-5369

[51] Int. Cl.⁴ ............................................. H03H 7/30
[52] U.S. Cl. .................................... 333/156; 333/139; 333/161; 336/149
[58] Field of Search ............... 333/156, 159, 160, 161, 333/162, 140, 139; 334/72; 336/139, 140, 149

[56] References Cited

U.S. PATENT DOCUMENTS

| | | | |
|---|---|---|---|
| 2,619,537 | 11/1952 | Kihn | 336/149 X |
| 2,781,514 | 2/1957 | Sichak et al. | 336/140 X |
| 3,193,785 | 7/1965 | Mann et al. | 336/139 X |
| 3,281,748 | 10/1966 | LaRosa | 336/139 |
| 4,160,962 | 7/1979 | de Keyser et al. | 333/156 X |
| 4,546,332 | 10/1985 | Kameya | 333/140 X |

FOREIGN PATENT DOCUMENTS

| | | | |
|---|---|---|---|
| 555942 | 4/1958 | Canada | 333/139 |
| 1149812 | 6/1963 | Fed. Rep. of Germany | 336/149 |
| 469332 | 4/1969 | Switzerland | 336/139 |

Primary Examiner—Eugene R. LaRoche
Assistant Examiner—Benny T. Lee
Attorney, Agent, or Firm—Wegner & Bretschneider

[57] ABSTRACT

This variable delay line makes use of a transmission line as a delay line element and is suitable for switching over the delay time of a high speed signal having for instance a rise time of one nanosecond or less. And this variable delay line includes a transmission line which includes an electroconductive path and a ground plate disposed opposingly with a dielectric body interposed therebetween, a fixed contact array consisting of fixed contacts provided at certain intervals along the electroconductive path, and a movable contact which may be slid along contacting the fixed contacts of the fixed contact array. Particularly, the movable contact contacts one of the fixed contacts in the fixed contact array in a first state and contacts two neighboring ones of the fixed contacts in the fixed contact array in a second state, and the movable contact may be slid over the fixed contact array by alternatingly repeating the first and the second states.

4 Claims, 14 Drawing Figures

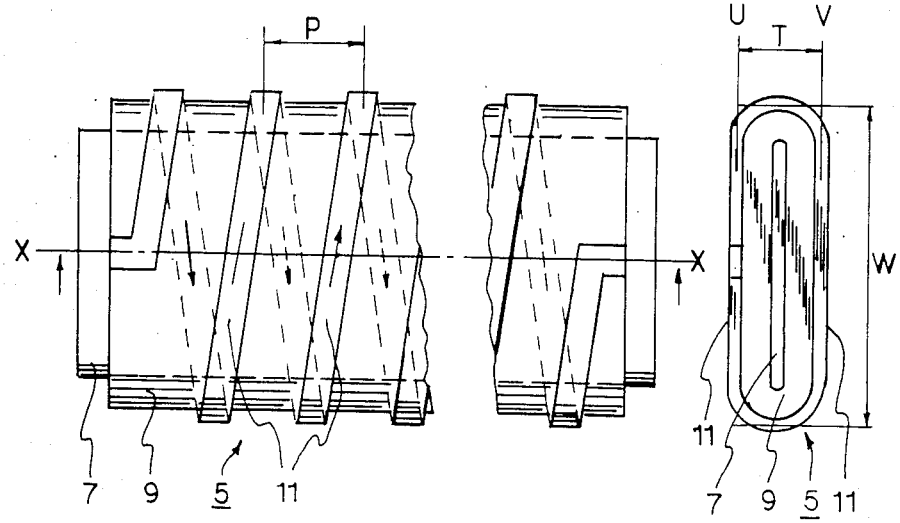
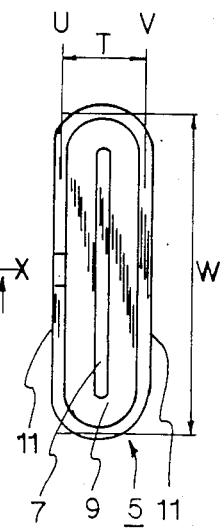
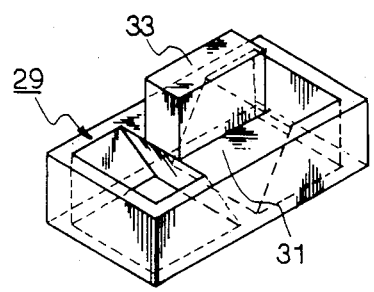

VARIABLE DISTRIBUTED CONSTANT DELAY LINE HAVING MOVABLE SLIDER CONTACT

BACKGROUND OF THE INVENTION

1. Field of the Invention

This invention relates to a variable delay line of a distributed constant type, and in particular to an improvement of a variable delay line using a transmission line such as a microstrip line.

2. Description of the Prior Art

Since a transmission line can function as a delay line, it has been known from the past that the delay time may be varied when a variable delay line is formed by using such a transmission line by providing fixed contacts in the electroconductive path of this transmission line at certain intervals and by changing the length of the electroconductive path over which a signal travels through switchover of these fixed contacts.

Such a variable delay line of a distributed constant type has advantages in that the structure is simple and the manufacturing cost may be kept low, and it is capable of varying the delay time of a high speed signal having an extremely fast rise time, for instance less than one nanosecond.

However, in order to increase the incremental resolution of the delay time, a large number of fixed contacts must be formed in the electroconductive path of the transmission line at small intervals. Therefore, when such a variable delay line is to be reduced in size and its incremental resolution is to be increased, it is necessary to form a large number of fixed contacts in the electroconductive path at small intervals, and the formation of the fixed contacts becomes difficult. Therefore, it has been extremely difficult to achieve both reduction in the size of such a variable delay line and also increase in the incremental resolution of said delay time at the same time.

SUMMARY OF THE INVENTION

A primary object of the present invention is to provide a variable delay line which can easily achieve both reduction in size and also improved incremental resolution of switchover in delay time, making good use of the features of a transmission line as a delay line element.

To achieve this object, the variable delay line of this invention comprises a transmission line comprising an electroconductive path and a ground plate disposed opposingly with a dielectric body interposed therebetween, a fixed contact array consisting of fixed contacts provided at certain intervals along the electroconductive path, and a movable contact which may be slid along contacting said fixed contacts of said fixed contact array; characterized in that said movable contact contents one of said fixed contacts in said fixed contact array in a first state and contacts two neighboring ones of said fixed contacts in said fixed contact array in a second state, and as said movable contact is slid over said fixed contact array its state alternates between said first state and said second state.

In a structure according to the present invention, when the movable contact slides along the fixed contact array in an alternating manner it (a) enters into a single contact with one individual one of the fixed contacts and (b) enters into a double contact with two neighboring ones of the fixed contacts, thereby it becomes possible to increase the incremental resolution of the delay time provided by the transmission line over that obtained in the prior art, when the movable contact only touches at the most one of the fixed contacts at one time. Therefore, because the incremental resolution can be increased according to this invention without any necessity of arranging a large number of fixed contacts along the electroconductive path at small intervals, it becomes possible to drastically reduce the size of the variable delay line and to achieve fine switchover of delay time.

BRIEF DESCRIPTION OF THE DRAWINGS

The present invention will now be shown and described with reference to the preferred embodiments thereof, and with reference to the illustrative drawings, which however are given for the purposes of explanation and exemplification only, and are not intended to be limitative of the scope of the present invention in any way. In the drawings:

FIGS. 3 and 4 are respectively a plan view and a side view of a delay line element included in the variable delay line of FIG. 1;

FIG. 5 is a perspective view of a holder shown in FIG. 1;

DESCRIPTION OF THE PREFERRED EMBODIMENTS

Figure 1:
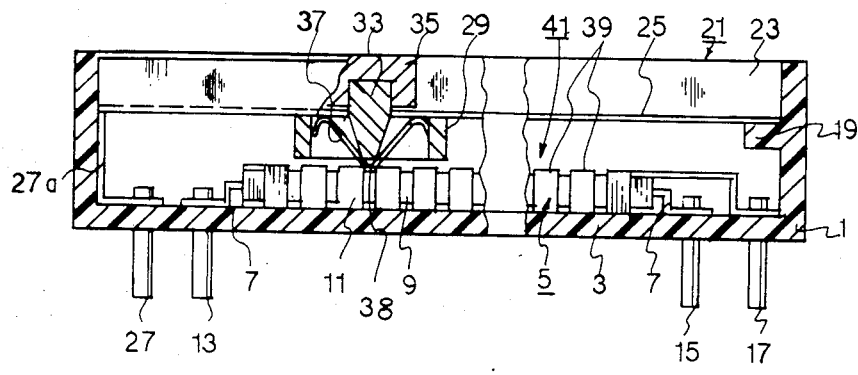
FIG. 1 is a front partial sectional view showing a preferred embodiment of the variable delay line of this invention.
Figure 2:
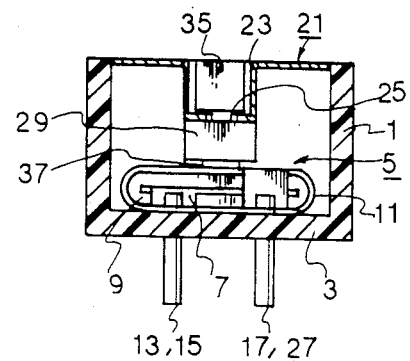
FIG. 2 is a side partial sectional view of the variable delay line of FIG. 1.

The present invention will now be described with reference to the preferred embodiments thereof, and with reference to the appended drawings. Referring to FIGS. 1 and 2, a case 1 is molded from synthetic resin in the form of an elongated box having an open upper side. A delay line element 5 is fixedly secured to the bottom 3 of the case 1 with its broader face downwards.

As shown in FIGS. 3 and 4, the delay line element 5 has an electroconductive path 11 which is folded round and round in a spiral manner at a pitch P over a dielectric body 9 formed on the outer surfaces and around the edges of an elongated ground plate 7, and part of the ground plate 7 projects from both the longitudinal ends of the dielectric body 9. Therefore, the electroconductive path 11 portion of the delay line element 5 is made to be relatively long, and opposes the surface of the ground plate 7, and is formed generally as a flat body. The delay line element 5 is fixedly secured to the bottom 3 of the case 1 with the broader surfaces of the ground plate 7 facing in the upwards and downwards directions, as shown in FIGS. 1 and 2.

The ground plate 7 of the delay line element 5 fixedly secured inside the case 1 is connected to input and output ground terminals 13, 15 formed in the bottom 3 of the casing 1 and penetrating therethrough. One end of the electroconductive path 11 is connected to an output terminal 17 which is likewise produced in the bottom 3, and the other end of the electroconductive path 11 is connected to the input ground terminal 13 by way of an internal terminal resistor $R_0$ (not shown in FIGS. 1 and 2).

A support piece 19 projects from the internal surface of the case 1 above the delay line element 5, and the open upper side of the case 1 is closed by an electroconductive plate 21 supported by the support piece 19. The electroconductive plate 21 is press formed and has a depression 23 which extends along the lengthwise direction of the delay line element 5, and the portion of the electroconductive plate 21 which forms the depression 23 is also provided with an elongated slit 25 which extends also along the lengthwise direction of the delay line element 5. The electroconductive plate 21 is connected to an input terminal 27 which is provided extending through the bottom 3 by way of a conductor 27a extending along the internal surface of the case 1.

Between the portion of the electroconductive plate 21 defining the depression 23 and the delay line element 5 is disposed a holder 29 which accomodates a movable contact spring 37 which will be described in detail later. This holder 29 is formed as a frame, and is provided with a partition plate 31 which divides this frame and a projection 33 which projects upwardly from the center of this partition plate 3 as shown in FIG. 5, and, as shown in FIGS. 1 and 2, the projection 33 projects into the depression 23 by way of the slit 25. And by affixing a knob 35 to this projection 33, the holder 29 is movably and slidably supported by the electroconductive plate 21.

The holder 29 accomodates a movable contact spring 37 which is formed by arcuately bending a strip of an electroconductive plate in such a manner that a middle bulging portion 38 thereof is elastically contacting the delay line element 5 and the two ends thereof are elastically contacting the electroconductive plate 21. The pitch P of the electroconductive path 11 in the delay line element 5 and the arcuately bent shape of the movable contact spring 37 are so selected that the middle bulging portion 38 of the movable contact spring 37, when said spring 37 is in certain positions, contacts two neighboring ones of the fixed contacts 39 defined by the upper surfaces of the turns of the spiral winding of the electroconductive path 11 at the same time; this state of affairs is shown in FIG. 1. Therefore, by moving the knob 35, the movable contact spring 37 is well as the holder 29 moves along the lengthwise direction of the delay line element 5 and the movable contact spring 37 moves across the electroconductive paths 11 of the delay line element 5 elastically contacting therewith while maintaining an elastic contact with the electroconductive plate 21. Furthermore, the movable contact spring 37, during its travel, either contacts just one of the fixed contacts 39, or simultaneously contacts two adjacent ones of said fixed contacts 39; and these conditions alternate as the movable contact spring 37 slidingly travels. Thus, for each winding of the delay line element 5, the portion of each electroconductive path 11 located on its upper surface functions as a fixed contact 39, and these fixed contacts 39, which are aligned along the lengthwise direction of the delay line element 5, form a fixed contact array 41.

If the delay line element 5 is formed in such a manner that the electroconductive path 11 is formed in a flat spiral at the pitch P by being alternatingly folded back over a first plane U and a second plane V which is parallel to the first plane U and is located at a distance T therebetween, as shown in FIG. 4, and the pitch P and the inter-plane distance T are selected so that for instance the ratio T/P is between zero and unity, the following advantages may be obtained. Namely, it becomes possible to increase the positive couplings in the electroconductive path 11, and a favorable delay property may be obtained by restricting the reduction in the line length due to the negative couplings in the electroconductive path 11, by employing the positive couplings.

Figure 6:
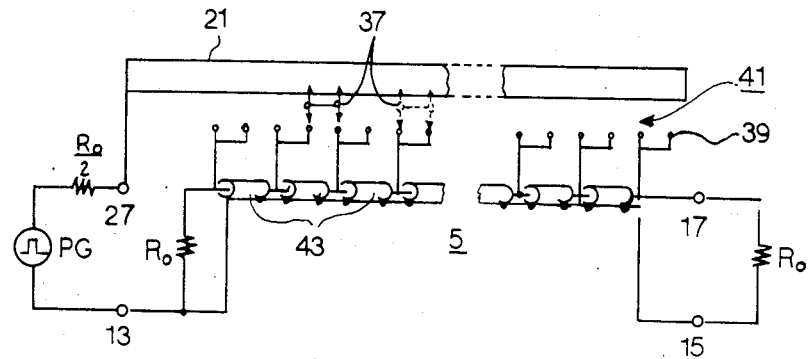
FIG. 6 is an equivalent circuit diagram for the variable delay line of FIG. 1.

The variable delay line of this invention may be expressed by an equivalent circuit in which a plurality of transmission lines (which will be referred to merely as unit lines 43) each having a delay time $t_d$, a characteristic impedance of $R_0$, and having same line lengths, are connected in series, and an internal terminal resistor $R_0$ is connected to the unit line 43 located at one end thereof, while a load resistor $R_0$ for taking out an output signal is connected to the unit line 43 located at the other end. And fixed contacts 39 are provided, one at each of the junctions of the unit lines 43, and one at each end at the junctions between the end unit lines 43, and the respective resistors $R_0$, thereby defining a fixed contact array 41; and the movable contact spring 37 moves over this fixed contact array 41 alternatingly entering into a single contact situation and a double contact situation. The position of the movable contact spring 37 indicated by broken lines in FIG. 6 shows a single contact situation, while the position of the movable contact spring 37 indicated by solid lines in FIG. 6 shows a double contact situation. Therefore, when a signal is inputted to an arbitrary one of the fixed contacts 41 from the input terminal 27 by way of the electroconductive plate 21, the signal is outputted after a delay time which corresponds to the number of the unit lines 43 located between the input point and the load resistor $R_0$.

Now, the working principle of the variable delay line of this invention will be described in the following, with reference to FIGS. 7 and 8. Here, it is assumed that the pulse generator PG in the drawings has an internal impedance of $R_0/2$, a rise time of $t_r$, and an electromotive force of $e_1$.

Figure 9A:
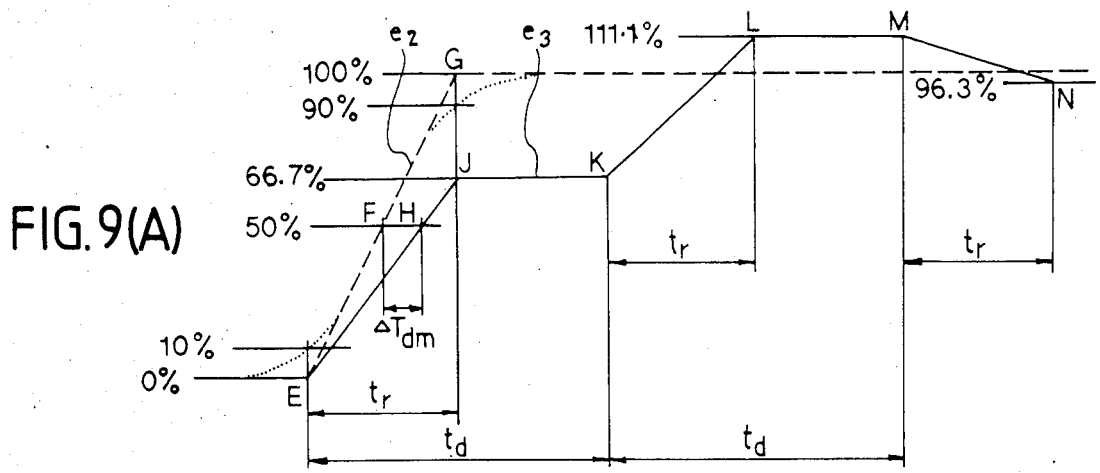
FIG. 9 is a set of three wave form diagrams relating to the operation of the variable delay line of FIG. 1.

First is explained the case in which the movable contact spring 37 is making a single contact with one of the fixed contacts 39 at an intermediate point of the fixed contact array 41. In this case, the pulse generator PG is connected to transmission lines 45, 47, respectively having a delay time $t_{d1}$ and a delay time $t_{d2}$, and both have a characteristic impedance $R_0$, which are connected in parallel, as shown in FIG. 7, and each of the transmission lines 45, 47 is terminated by a resistor $R_0$, while the output is taken out from the transmission line 45 having the delay time $T_{d1}$. Because the two transmission lines 45, 47 are connected in parallel to the input point $P_1$ of the transmission lines 45, 47, the impedance at the input point $P_1$ is $R_0/2$. The voltage $e_2$ at the point $P_1$ is:

$$e_2 = e_1/2 \ldots \quad (1)$$

and as shown by the broken line in FIG. 9A, has the same rise time $t_r$ as the voltage $e_1$, but has an amplitude which is only one half as much. In FIG. 9, only the rise portion is shown, for the convenience of description. Further, a rise time generally means the time interval between 10% and 90% of the amplitude, and the waveform is generally a smooth curve as shown by the dotted line in FIG. 9A near 0% amplitude and 100% amplitude. However, for the convenience of description, it is assumed that the waveform linearly rises in time $t_r$ as indicated by the broken line between E and G in FIG. 9A between zero amplitude and 100% amplitude.

And at the output side of the transmission line 45 to which the voltage $e_2$ is applied, an output voltage which is delayed by time $T_{d1}$ therefrom may be taken out. Also, at the other transmission line 47, an output voltage having a delay time of $T_{d2}$ is obtained, and is consumed in the internal terminal resistor $R_0$.

Next is explained the state in which the movable contact 37 has moved from the single contact state one step to the left in FIG. 6 to the double contact state (the double contact state shown in FIG. 6 is three steps away from the single contact state shown therein). In this case, as shown in FIG. 8, the transmission line 45 for taking out an output signal has a delay time $T_{d1}$ which is the same as the single contact state, while the other transmission line 49 has a delay time $T_{d3}$ which is shorter by the delay time $t_d$ belonging to the unit line 43 between two neighboring contacts. In this double contact state, the two ends of the single unit line 43 are short circuited by the movable contact spring 37, and the one ends of the transmission lines 45, 49 and the two ends of the single unit line 43 are connected to the pulse generator PG in parallel.

Figure 7:
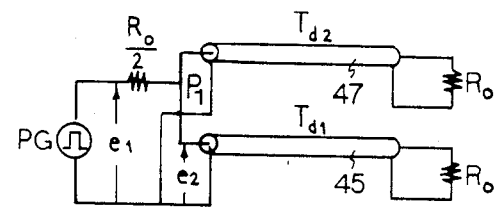
FIG. 7 is a view illustrating the action during a single contact situation of the variable delay line of FIG. 1.
Figure 8:
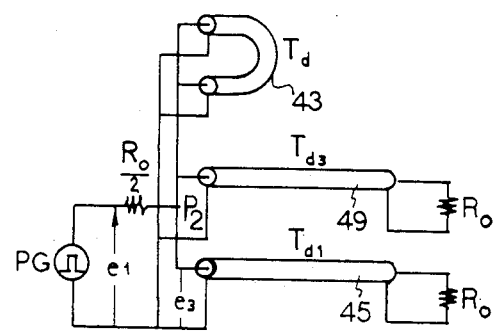
FIG. 8 is a view illustrating the action during a double contact situation of the variable delay line of FIG. 1.

Since, in the double contact state, a result which is different from that of the single contact state can be obtained when the same pulse signal voltage $e_1$ as FIG. 7 is applied thereto, due to the relationship between the rise time $t_r$ of the pulse generator PG and the delay time $t_d$ of the unit line 43, this will be discussed in the following with reference to FIG. 9. In FIG. 9, the solid line indicates a voltage waveform $e_3$ during the double contact situation.

First is described the case in which $t_d$ (the delay time) is greater than $t_r$ (the rise time), with reference to FIG. 9A. This relationship is not desirable from a practical viewpoint, but nonetheless this case will be explained as a starting point for the convenience of explanation. Because the input point $P_2$ to the transmission lines 45, 49 has four lines connected in parallel, the impedance at the input point $P_2$ is $R_0/4$. Therefore, the voltage $e_3$ at this point $P_2$ is:

$$e_3 = \left[ \frac{\frac{R_0}{4}}{\frac{R_0}{2} + \frac{R_0}{4}} \right] e_1 = \frac{e_1}{3} \quad (2)$$

and the ratio of the voltage $e_3$ during the double contact situation to the voltage $e_2$ during the single contact situation is:

$$e_3/e_2 = \tfrac{2}{3} \approx 0.667 \ldots \quad (3)$$

Therefore, the voltage $e_3$ rises in the same rise time $t_r$ as the first rise (E—J of FIG. 9A) up to 66.7% amplitude of the voltage $e_2$. And with respect to the unit line 43 whose two ends are connected to the input point $P_2$, the first rise signal propagates from the two ends towards the other ends at the same time, and reaches the two ends after the time $t_d$.

This unit line 43 is equivalent to a circuit in which a signal transmission line having a characteristic impedance of $R_0/2$ and a delay time of $t_d/2$ is connected with its other end kept open, and the signal reflected at the open end returns to the input point $P_2$ after a two way travel time of $t_d$. Analysis is simplified in this way. Part of the returned signal is added to the voltage $e_3$ at the input point $P_2$, and becomes the second rise indicated by K—L in FIG. 9A, and a part thereof is again reflected back to the open end.

In regards to this second rise, assuming that the degeneration of the signal propagating through the unit line 43 is negligible because the length of the unit line 43 is short, the reflection coefficient $\rho$ as seen from the unit line 43 to the input point $P_2$ is:

$$\rho = \frac{\frac{R_0}{4} - \frac{R_0}{2}}{\frac{R_0}{4} + \frac{R_0}{2}} = -\frac{1}{3}. \quad (4)$$

Therefore, from equations (2) and (4), the following equation:

$$e_3 = e_1/3 + (e_1/3)(1+\rho) = 5/9\, e_1 \quad (5)$$

holds, and therefore:

$$e_3/e_2 = 10/9 \approx 1.111 \quad (6)$$

holds. Therefore, in FIG. 9A, the second rise begins after the time $t_d$ from the start point E of the first rise, and reaches 111.1% of the voltage $e_2$ after the time $t_r$ as indicated by K—L.

Thereafter, in the unit line 43 of $t_d/2$, the signal repeats the reciprocating reflection, and affects the voltage $e_3$ according to the reflection coefficient $\rho$, which is $-166$ as per equation (4). Therefore, after the time $t_d$ from the beginning point K of the second rise, the signal drops to 96.3% of the amplitude in the time $t_r$ as indicated by M—N of FIG. 9A. Although it is not so shown in the drawings, the wave form alternately repeats a rise and decline for each time interval $t_d$ to 101.2% amplitude, 99.6% amplitude, and so on, thus converging to 100% amplitude.

As a result, as shown by FIG. 9A, the voltage $e_3$ is delayed by $\Delta T_{dm}$ with respect to the voltage $e_2$, during the interval F—H which is the 50% amplitude of the voltage $e_3$. This $\Delta T_{dm}$ may be expressed by equation (7) from the proportionally calculation, based upon similar triangles:

$$\Delta T_{dm} = 0.25 t_r \quad (7)$$

Thus, under the condition that $t_d$ (the delay time) is greater than $t_r$ (the rise time), the wave form at the input point $P_2$ during the double contact situation is an irregular wave form having the first and second rises. However, as compared to the single contact situation, there arises the delay time $\Delta T_{dm}$, which is $0.25 t_r$ delay at the 50% amplitude, the delay time of $T_{d1}$ plus $\Delta T_{dm}$ arises also at the output end of the transmission line 45, and the delay time is increased by $\Delta T_{dm}$ over the single contact.

Figure 9B:
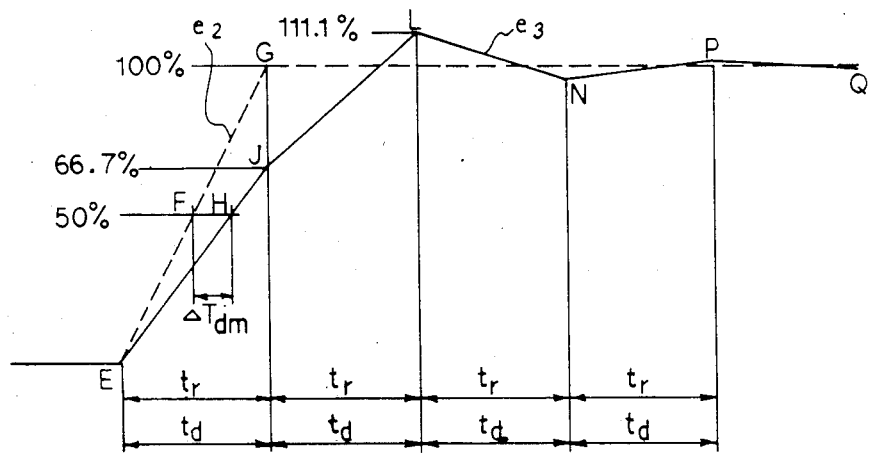

Next is explained the case in which $t_d$ (the delay time) equals $t_r$ (the rise time), with reference to FIG. 9B. In this case, the wave form is J—K, L—M, and so on, in FIG. 9A, minus the horizontal portions. Therefore, the first rise, the second rise, and so on are connected continuously. Because in this case also the voltage $e_3$ involves the delay time of $\Delta T_{dm}$ equal to $0.25t_r$, during the interval F−H of the 50% amplitude relative to the voltage $e_2$, in the same way as in equation (7), the output end of the transmission line 45 involves the delay time of $T_{d1}$ plus $\Delta Tdm$, thus resulting in a delay time which is $\Delta T_{dm}$ greater than the single contact state. And this case is also not a desirable condition.

Now will be described the case in which $t_d$ (the delay time) is smaller than $t_r$ (the rise time), with reference to FIG. 9C. In this case, the start point K of the second rise precedes the end point J of the first rise, and the signal rises from the start point E of the first rise to the point J initially. However, after the time $t_d$ therefrom, a signal which forms the second rise is produced from the two ends of the unit line 43, and is added to the first rise and therefore the slope of the rise in increased, so that the signal rises from the point K to the point J'. However, the interval K−J' is not necessarily a straight line, and the increase and the decrease in the slope are repeated for each time interval $t_d$, over K−L−N−P−J', and finally the degrees of the increase and the decrease of the slope diminishes and the magnitude of the slopes ultimately converges to the same value as that of the rise of the voltage $e_2$ in the single contact state, or the slope of the interval E−G indicated by a broken line in FIG. 9C. The magnitudes of the increase and the decrease of the slope can be easily obtained by sequentially adding the values of the output of the reflected signals, based upon the reflection coefficient of equation (4). After the point J', the slope becomes smaller because of the completion of the first rise portion, but the signal reaches the point S, which is approximately the 100% amplitude, after the time $t_r$ from the beginning point K of the second rise. In this case, the voltage $e_3$ involves the delay time $\Delta T_d$ as follows:

$$T_d \approx 0.25 t_d \quad (8)$$

with respect to the voltage $e_2$ over the interval F−H of 50% amplitude.

In other words, in the cases in which $t_d$ (the delay time) is greater than $t_r$ (the rise time), and td (the delay time) is equal to $t_r$ (the rise time), as shown in FIGS. 9A and 9B, the delay time $\Delta T_{dm}$ between the voltage $e_2$ and the voltage $e_3$ is dependent only on the rise time $t_r$ of the input signal $e_1$, and is not dependent on the delay time $t_d$ of the unit line 43. However, in the case in which $t_d$ (the delay time) is smaller than $t_r$ (the rise time), or, to be accurate, $t_d$ is equal to or smaller than $0.75t_r$, the delay time $\Delta T_d$ between the voltage $e_2$ and the voltage $e_3$ is dependent on the delay time $t_d$ of the unit line 43. And when the delay time $t_d$ is relatively near $0.75t_r$, the delay time $\Delta T_d$ varies over the range of $0.22t_d$ to $0.33t_d$, according to the ratio of the delay time $t_d$ to the rise time $t_r$, but as the delay time td becomes smaller as compared to the rise time $t_r$ the delay time $\Delta T_d$ becomes more and more constant at $0.25t_d$.

Therefore, in this case, with reference to FIG. 6, as the movable contact spring 37 is moved to the left step by step from the rightmost position repeating the single contact situation and the double contact alternately, the delay time obtained at the output end changes from zero through $0.25t_d$, $t_d$, $1.25t_d$, $2t_d$, $2.25t_d$, and so on. In other words, it is possible to have an incremental resolution of delay time width which is finer than the delay time $t_d$, with the delay time $t_d$ of the unit line 43 used as a unit. On the other hand, when $t_d$ is greater than $0.75t_r$, the delay time $\Delta T_{dm}$ between the voltage $e_2$ and the voltage $e_3$ is determined by $0.25t_r$ or the rise time $t_r$ alone, and is not dependent on the delay time $t_d$. Therefore, the greater the delay time $t_d$ becomes, as compared to the rise time $t_r$, the smaller the delay time difference between the single contact state and the double contact state becomes, and the effect of increasing the incremental resolution diminishes. Additionally, the waveform becomes irregular as shown in FIGS. 9A and 9B.

Figure 9C:
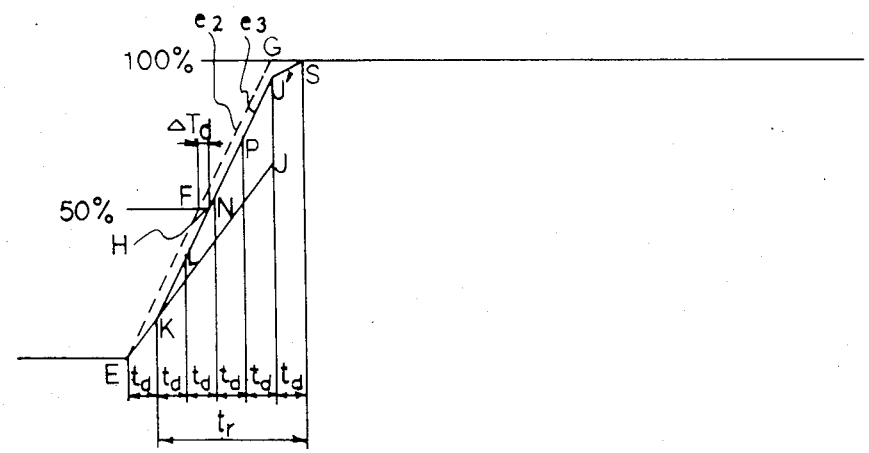

However, when a variable delay line is to be used in reality, it is rare to have the cases shown in FIGS. 9A and 9B, and in most cases the actual situation is as shown in FIG. 9C. For instance, the highest speed type ECL (a type of super high speed logic circuit IC) has a rise time $t_r$ of output signal of 700 ps or so (this is the interval between 20%−80% of the final amplitude). As a variable delay line which is suited for adjusting the delay time of this output signal, forty unit lines 43 each having the delay time $t_d$ of 50 ps can be used with a total variable range of delay time of 2 ns. In this case, the delay time $t_d$ becomes 0.0714tr, and it can satisfy the above mentioned necessity with a margin of one order or more. If this condition is not satisfied and an unexpected high speed pulse signal is applied, a filter circuit may be inserted between the input terminal 27 and the electroconductive plate 21 for slowing down the rise of the input signal, and the filter function may be provided by the electroconductive plate 21, the movable contact spring 37, and so on.

In the above analysis, it has been assumed for the requirements of explanation that the delay time is the same for all the unit lines 43, but if these delay times are increased gradually in this invention an advantage may be obtained in that the delay time $\Delta t_d$ may be likewise increased, if it remains within the range in which equation (8) applies.

Figure 10:
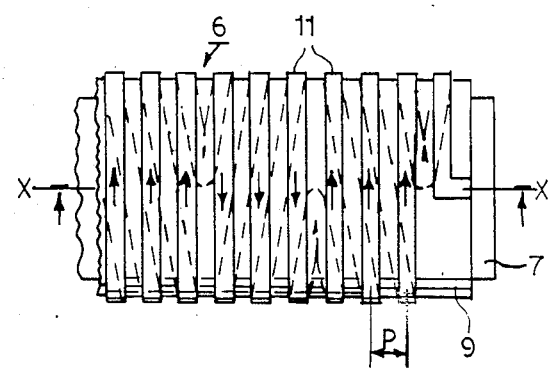
FIGS. 10 and 11 are respectively a plan view and a side view, similar to FIGS. 3 and 4 respectively, and showing the delay line element incorporated in another preferred embodiment of the variable delay line of this invention.
Figure 11:
Figure 12:
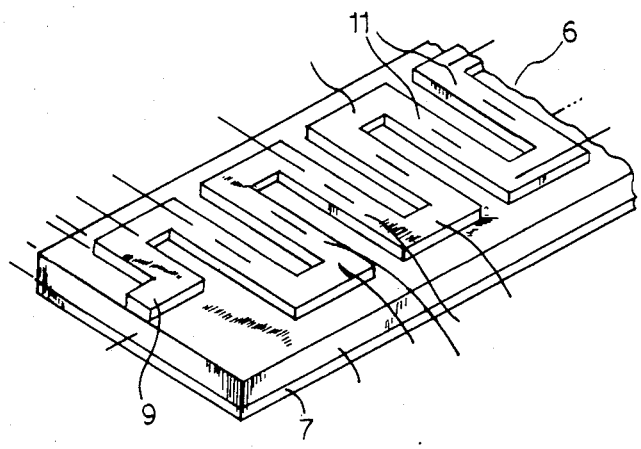

The variable delay line of this invention described above may not necessarily use a delay line element 5 which is formed by spirally bending back an electroconductive path 11 as shown in FIG. 3, but may also use a delay line element 6 as shown in FIGS. 10, and 11 and 12.

Specifically, an electroconductive path 11 is wound over a dielectric body 9 formed on a ground plate 7 by spiral winding in a first direction for a few turns, and the electroconductive path 11 is then wound in the opposite direction over the succeeding few turns, and further the direction of the winding is then reversed every few turns. In other words, the delay line element 6 is formed by changing the winding direction of the electroconductive path 11 alternatingly each few turns as it is wound along the lengthwise direction X−X of the ground plate 7. When such a delay line element 6 is used, because a new negative coupling arises at each change of the direction of the winding of the electroconductive path 11, the positive couplings increased by winding the electroconductive path 11 may be controlled by these negative couplings. Therefore, even if the delay line element 5 shown in FIG. 3 is reduced in size and its positive couplings are made more strong than is required or desirable, it is possible to restrain the positive couplings and to obtain a favorable property.

This invention is not limited to the above described delay line elements, but may be implemented by using a transmission line consisting of a coaxial cable, a transmission line which is made by forming an electroconductive path on one surface of a ground plate by way of a dielectric body, or a transmission line. Thus, although the present invention has been shown and described with reference to certain preferred embodiments thereof, and in terms of the illustrative drawings, nevertheless its scope is to be defined only by the appended claims, since various possible modifications, omissions, and alterations can be conceived of by one skilled in the art to the form and the content of any particular embodiment, without departing from the scope of the present invention.

What is claimed is:

1. A variable distributed constant delay line comprising a transmission line comprising an electroconductive path and a ground plate which is disposed in an opposing relationship to said electroconductive path and a dielectric body interposed therebetween, a fixed contact array consisting of fixed contacts provided at predetermined intervals along the electroconductive path, and a movable contact which may be slid along and which contacts said fixed contacts of said fixed contact array;

wherein said movable contact contacts one of said fixed contacts in said fixed contact array in a first position and contacts two neighboring ones of said fixed contacts in said fixed contact array in a second position, so that as said movable contact is slid along said fixed contact array its position alternates between said first position and said second position, forming a short circuit in said second position which causes a signal sent from the one of said fixed contacts to reflect back and forth between the one of said fixed contact and one of said neighboring contacts.

2. A variable delay line according to claim 1, wherein said transmission line is formed by spirally winding said electroconductive path over the outer surface of an elongated dielectric ground plate.

3. A variable delay line according to claim 2, wherein said electroconductive path of said transmission line is reversed in its winding direction at an intermediate point along said electroconductive path.

4. A variable delay line according to claim 1, wherein said transmission line is formed by disposing said electroconductive path on a dielectric body which lies on one surface of a ground plate.

* * * * *